United States Patent [19]

Ames

[11] 3,852,795

[45] Dec. 3, 1974

[54] JOSEPHSON TUNNELING CIRCUITS WITH SUPERCONDUCTING CONTACTS

[75] Inventor: Irving Ames, Peekskill, N.Y.

[73] Assignee: International Business Machines Corporation, Armonk, N.Y.

[22] Filed: Jan. 3, 1973

[21] Appl. No.: 320,784

[52] U.S. Cl. .......................................... 357/5, 357/4

[51] Int. Cl. ............................ H01l 9/00, H01l 3/00

[58] Field of Search ...... 317/234 S, 234 T; 307/306; 331/107 S

[56] References Cited

UNITED STATES PATENTS 3,733,526 5/1973 Anocher ........................ 317/234 R

OTHER PUBLICATIONS

Chudhari et al., "IBM Tech. Discl. Bull.," Vol. 14, No. 5, Oct. 1971.

Lumpkin, "IBM Tech. Discl. Bull.," Vol. 10, No. 5, Oct. 1967.

*Primary Examiner*—Martin H. Edlow

*Attorney, Agent, or Firm*—Sughrue, Rothwell, Mion, Zinn & Macpeak

[57] ABSTRACT

A Josephson tunnelling circuit is fabricated by forming layers of insulation and superconducting metallization on a substrate. The layers form Josephson tunnelling junctions, superconducting lines, superconducting contacts and other elements which may be needed. Josephson tunnelling junctions are formed by three layers, a thin tunnelling oxide between two superconducting layers. Superconducting contacts are formed between either of the two superconducting layers and an overlying third superconducting layer. The latter layer includes a metal, preferably indium, which has a free energy of oxide formation which is at least as high — or higher — than the alloys forming the first and second layers.

12 Claims, 8 Drawing Figures

JOSEPHSON TUNNELING CIRCUITS WITH SUPERCONDUCTING CONTACTS

BACKGROUND OF THE INVENTION

The present invention is in the field of fabrication of Josephson tunnelling circuits and resulting products. More particularly the invention is directed to improved superconducting contacts between two superconducting metal layers in a Josephson tunnelling circuit.

It is well known in the art that Josephson tunnelling devices consist of superconducting metal layers and have characteristics which cause them to perform various circuit functions, e.g., switching. A basic type of Josephson tunnelling device is a Josephson tunnelling junction and consists essentially of a first superconducting metal referred to as a base electrode, a second superconducting metal referred to as a counterelectrode, a tunnelling oxide positioned in sandwich fashion between the base and counterelectrodes, and a third superconducting metal overlying and insulated from the "sandwich" portion. The latter metal is used to control the tunnelling current. The latter metal is usually in the form of a line which is referred to as the control line. The device described is formed on a substrate containing an insulator layer on a superconducting ground plane.

A Josephson tunnelling circuit includes a number of elements, e.g., Josephson tunnelling junctions, superconducting lines for intraconnecting the junctions in a desired circuit arrangement, and insulated crossings and superconducting contacts between superconducting lines. A preferred manufacturing technique is to form the circuit using only three layers of superconducting metallization over the ground plane. For the Josephson tunnelling devices, the three layers correspond, respectively, to the base electrodes, counter electrodes and control lines. The three layers may also include superconducting intraconnectors and superconducting contacts.

A top and cross-sectional side view of a typical Josephson device 10 is shown in FIG. 1A and 1B, respectively. The dimensions of the drawings are for illustrative purposes only and do not represent either actually or relatively the dimensions of a Josephson tunnelling device. The substrate, shown only in FIG. 1B, comprises superconducting ground plane 12 and insulator layer 14 and an underlying support 25. The three layers of metallization are deposited onto the substrate in the order described below. Photoresist masks and photolithographic techniques are used to achieve the desired area and shape of each of the metal layers. These photoresist masks are typically formed by spinning photoresist onto a substrate, curing the photoresist by heating, exposing the photoresist to light, and developing the photoresist to remove the exposed portions. The base electrode 16 is first placed on the substrate. Next the tunnelling oxide 18 is created on the base electrode in the area where the junction is to be formed. This is followed by a deposition of the counterelectrode 20.

In the illustration shown, the same mask is used for creating the tunnelling oxide and for depositing the counterelectrode. The mask has openings corresonding to the shape of the counterelectrodes. The advantage of using the same mask for forming the tunnelling oxide and the counterelectrode is that it reduces the number of steps required in the process and it eliminates handling of the metallized substrate during these steps as the substrate does not have to be removed from the vacuum chamber to form a new mask.

Next, an insulating layer 22 is placed over the layers as illustrated. The purpose of the insulating layer 22 is to electrically isolate the control line 24 (to be subsequently deposited) from the base and counterelectrodes. The insulator layer 22 may be confined to those areas where insulation is needed, or may cover the entire substrate area. In the case where the insulating layer 22 covers the entire substrate area, it is necessary to form via holes therein at specified places to allow the formation of superconducting contacts to the base and counterelectrodes.

The metal layers are formed by conventional evaporation deposition in a vacuum chamber and the tunnelling oxide is preferably formed by an r.f. oxidation technique described by J. A. Greiner in, "Josephson Tunnelling Barriers by r.f. Sputter Etching in an Oxygen Plasma," which appears on pages 5151 – 5155 of the *Journal of Applied Physics*, Vol. 42, Number 12, Nov. 1971.

When an entire circuit is formed on a substrate, other devices and other intraconnecting superconducting lines may be formed simultaneously with the formation of the devices described above. In order to defined the metal layers by their order of formation rather than by their functions, the M2 layer of metallization includes all the base electrodes and any other superconducting lines formed simultaneously therewith, the M3 layer includes all the counterelectrodes and any other superconducting lines formed simultaneously therewith, and the M4 layer includes all of the control lines and any other superconducting lines formed simultaneously therewith. Superconducting contacts are formed between M2 – M4 layers and between M3 – M4 layers. Contacts are not formed between M2 – M3 layers because, when the single masking step as described above is used, all M2 layer regions exposed to deposition of an M3 layer will also have been exposed to formation of the tunnelling oxide. A contact between M2 – M3 would thus not be a superconducting contact but would form an additional unwanted tunnelling junction.

The M2 layer is preferably an alloy consisting mostly of lead (Pb). As is well known lead makes a good superconducting line. It is also known, as is described in the above-mentioned article by J. H. Greiner, to include indium (In) in the alloy which is the M2 layer. The addition of (In) to the M2 layer causes the RF oxidation step, described above, to work very well. Also, it is preferable to include gold (Au) in the M2 layer (and in the other layers). As described in U.S. patent application Ser. No. 654,315, by Syamal K Lahiri, entitled, "Josephson Junction Device Having Intermetallic in Electrode," filed Aug. 10, 1972, a continuation of application Ser. No. 103,088 filed Dec. 31, 1970, the addition of gold to the metal layers prevents adverse stress relaxation effects.

As pointed out above, the indium is included in the M2 layer because it enhances the r.f. oxidation process used to form the tunnelling oxide. It has been found that the addition of indium to the M3 layer can cause the Josephson tunnelling current to increase to the level where the tunnelling junction is indistinguishable from a superconducting short.

SUMMARY OF THE INVENTION

In accordance with the present invention superconducting contacts on a Josephson circuit are formed between M2 – M4 layers and between M3 – M4 layers with the M4 metal layer including a superconducting metal having a higher free energy of oxide formation than that of the alloys of either the M2 or M3 layers. The superconducting metal is preferably indium.

The present invention preferably uses indium even though, as described above, indium in the M3 layer can be destructive of the tunnelling junction. In fact the characteristic of the indium which is believed to cause destruction by formation of superconducting shorts is made use of advantageously in the present invention.

The tunnelling oxide is a very thin layer and is an oxide of the M2 alloy, the latter consisting mostly of lead in a preferred case. If indium is used in forming the M3 layer, the evaporation deposition of indium results in energetic indium atoms striking the oxide. The oxide is penetrated or chemically reduced at points therein causing the M3 layer to contact the M2 layer. It is believed that the reason this occurs is because the indium has a higher free energy of oxide formation than the M2 alloy.

In the present invention superconducting contacts are made by including a metal having a relatively high free energy of oxide formation in the metal layer forming the top layer of the superconducting contact.

When the M2 and M3 layers are formed, a thin oxide coating forms on those layers. This is not the thin tunnelling oxide which is purposely formed but is a thin oxide which is unavoidably formed. At points on the layers which are to form superconducting contacts with a subsequently deposited M4 layer, the oxide would normally prevent a superconducting contact from being formed. Sputter etching can be used in an attempt to clean away the oxide but this is rarely sufficient to render the M2 and M3 surfaces free of contaminates just prior to deposition of the M4 layer.

In accordance with the present invention, when a metal having a higher free energy of oxide formation than the underlying alloy is deposited on the underlying alloy, a good superconducting contact if formed whether or not a sputter etching step is performed to clean-off the surface of the underlying alloy.

DETAILED DESCRIPTION OF THE DRAWINGS

Figure 1A:
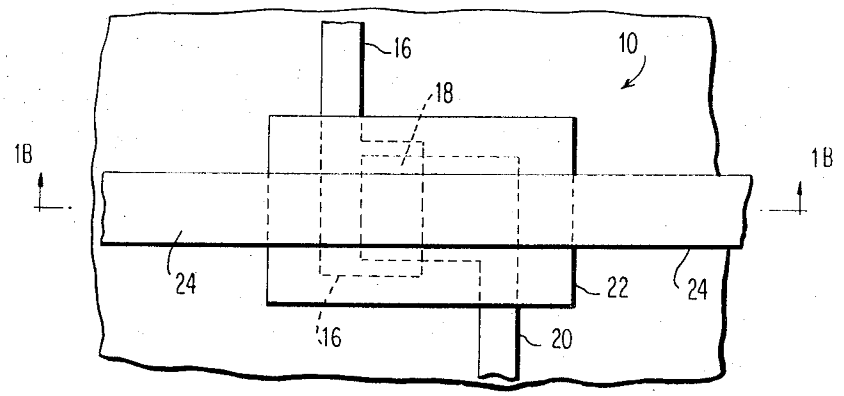
FIG. 1A PRIOR ART
FIGS. 1A and 1B are a top view and cross-sectional side view of a typical prior art Josephson tunnelling junction containing an overlying, insulated control.
Figure 1B:
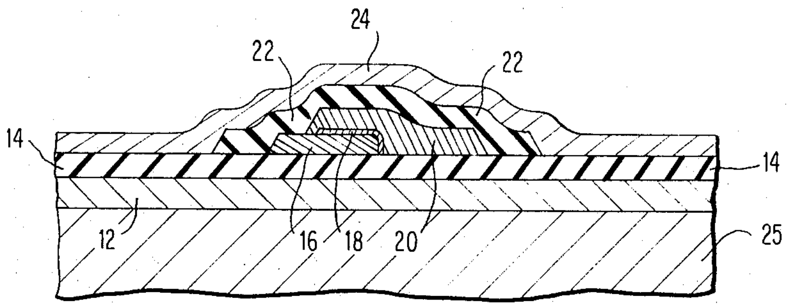
FIG. 1B PRIOR ART

FIGS. 1A and 1B have already been described in detail in the background section of this application. A process for forming a Josephson tunnelling circuit, including superconducting contacts, will be described in connection with FIGS. 2A – 2D. In those figures, like elements are designated by the same numerals. Also, it will be understood that an actual circuit may include many more elements than the one junction and two superconducting contacts shown in the drawings. However, the limited number of elements shown is sufficient to provide a full understanding of the invention.

Figure 2A:
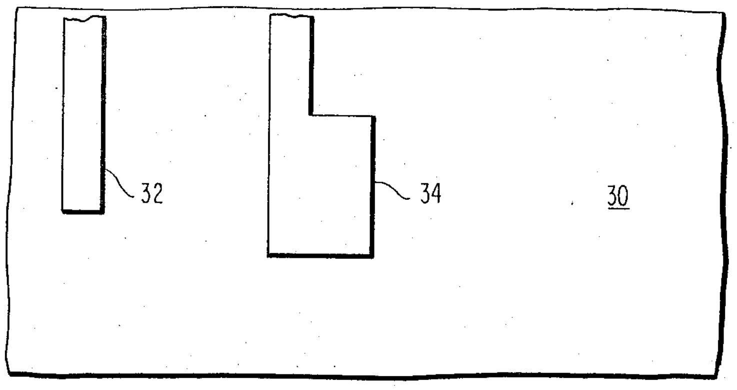
FIGS. 2A – 2D are top views of a portion of a Josephson tunnelling circuit at various stages of completion of a process for forming the circuit.

Referring to FIG. 2A, the top surface of substrate insulating layer 30 is shown with patterns 32 and 34 of superconducting metal layer M2 formed thereon. A ground plane, not shown, is beneath the insulating layer 30. The patterns 32 and 34 may be formed as follows. A photoresist mask having openings therein corresponding to shapes 32 and 34 is formed by conventional techniques. The metals forming M2 can then be deposited on the substrate through the photoresist mask.

The M2 layer is preferably deposited by placing the substrate in a vacuum chamber using evaporation deposition of the metals forming the M2 layer. The metal could be any suitable superconducting metal, e.g., lead, aluminum, tin, niobium, indium, but is preferably a ternary alloy of lead, indium and gold. In a specific preferred example the vacuum chamber is reduced to a pressure of about $2 \times 10^{-7}$ Torr, and following sputter etching of the exposed substrate to enhance adhesion, a 500A. layer of indium is deposited, followed by a 100A. layer of gold, followed by a 3,500A. layer of Pb. During subsequent steps of fabrication, which introduce heating to the substrate, the M2 layer becomes a ternary alloy of the three metals mentioned.

The substrate is removed from the vacuum chamber and the photoresist mask is removed by emersion in acetone, thus leaving the structure shown in FIG. 2A. In the particular configuration described herein, the part 34 is the base electrode of a Josephson tunnelling junction, and part 32 may be an extension of the base electrode of another junction, not shown, or simply may be a superconducting line which will be connected to other lines or electrodes by means of superconducting contacts.

Figure 2B:
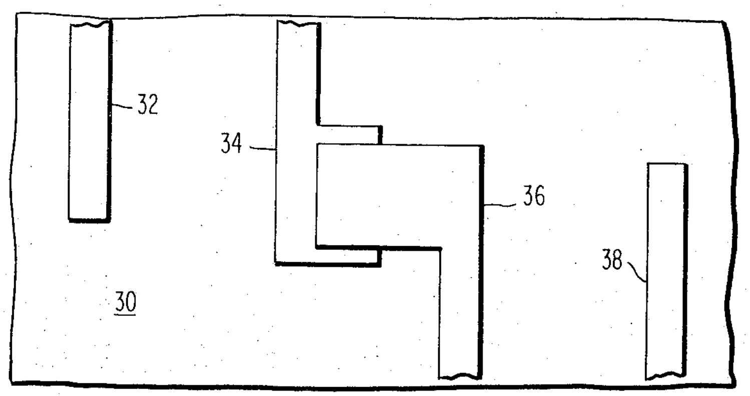
Figure 2C:
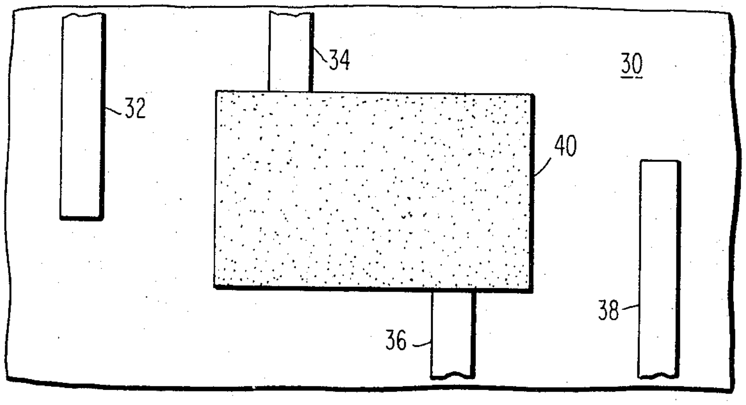
Figure 2D:
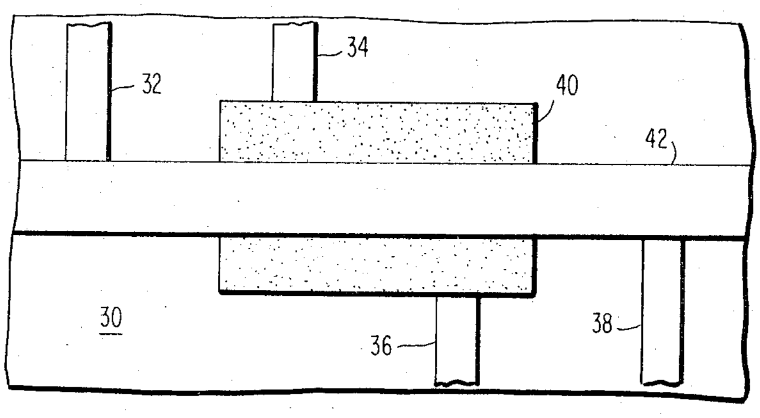

Following formation of the M2 layer as described above, a second photoresist mask having openings corresponding to shapes 36 and 38 of FIG. 2B is formed on the substrate. The openings in the mask correspond in shape to the M3 layer, and this mask is used for formation of the tunnelling oxide and for deposition of the M3 layer. The area where the tunnelling oxide is to be formed is shown in FIG. 2B by the area of base electrode 34 which is overlapped by counterelectrode 36. When one mask is used for the r.f. oxidation step and the M3 deposition step, more than just the desired area of base electrode 34 will be exposed during the r.f. oxidation step. However, the remainder of the exposed area is on the substrate and consequently, r.f. oxidation will have no adverse effect there.

The masked substrate is placed in a vacuum chamber. Oxygen is introduced into the chamber and the tunnelling oxide is formed by r.f. oxidation as described in the Greiner article mentioned above. The chamber is then pumped down to a pressure of about $2 \times 10^{-7}$ Torr, and without removing the chip, the M3 layer is deposited by evaporation deposition through the mask. The M3 layer may comprise any suitable superconducting metal but the first deposited metal of the M3 layer should not be a metal, such as indium, having a higher free energy of oxide formation than the M2 layer. For example, if the M2 layer comprises the metal described in the specific example above, a deposition of indium on the tunnelling oxide will cause formation of a superconducting contact between M2 and M3 and thus prevent formation of the desired tunnelling junction.

The M3 layer is preferably formed of lead with a small amount of gold to prevent adverse stress relaxation effects in the layer. As a specific example, a 3,000A. layer of lead is deposited followed by a 50A. layer of gold followed by a 2,000A. layer of lead. During subsequent masking steps, heat is introduced to the substrate and the multilayered M3 layer looses its multilayer character and becomes an alloy of gold and lead.

The next step in the fabrication is to provide isolation where required between the metal layers M2, M3 and the to-be-formed control layer M4. A means for achieving this is to form a photoresist mask and then form an insulating layer where needed for this purpose by deposition through the mask. The insulating layer 40, shown in FIG. 2C ovelies the junction. As an alternative the insulating layer could be formed covering the entire substrate. In the latter case holes would have to be made in the insulating layer over certain portions of the M2 and M3 layers where it is desired to form superconducting contacts with the M4 control layers. The insulating layer may be formed by vacuum evaporating a layer of SiO onto the substrate.

The next step is to form the M4 layer and the superconducting contacts between segments of the M4 control layer and either the M2 or M3 layers. Another photoresist mask is placed on the substrate. This mask has illustrative openings corresponding to the M4 metallization 42 shown in FIG. 2D. As will be appreciated, the only portions of M2 and M3 exposed by the mask are the portions of those layers intended to form superconducting contacts with portions of the M4 layer. In the drawing, the edge of portions of M2 part 32 and M3 part 38 are exposed.

Sputter etching may then be used to remove most of the inherent oxide film on the exposed portions of parts 32 and 38. This will enhance the superconductivity of the contacts but is not necessary to the formation of a superconducting contact. Next, the M4 layer is formed on the chip in the mask opening and the mask is removed.

In order to form a superconducting contact the M4 layer includes therein a metal having a higher free energy of oxide formation than either the M2 or M3 layers. In the specific example described thus far, the M2 and M3 layers consist essentially of lead. Metals which have a higher free energy of oxide formation than lead and which should be suitable in the M4 layer are; indium, gallium, tin, aluminum, lanthanum, manganese. These metals tend to act as reducing agents with respect to lead oxide. The preferred metal is indium.

In a specific example the M4 layer is formed in a vacuum chamber at about $2 \times 10^{-7}$ Torr. By evaporation deposition process a 1,000A. layer of indium is first deposited, followed by a 7,500A. layer of lead, followed by a 200A. layer of gold. The gold is added for the same reason that it is added to the M2 and M3 layers. The resulting M4 layer shown in FIG. 2D, comprises a superconducting control line for the tunnelling junction which forms superconducting contacts with parts 32 and 38 of layers M2 and M3, respectively.

Figure 3A:
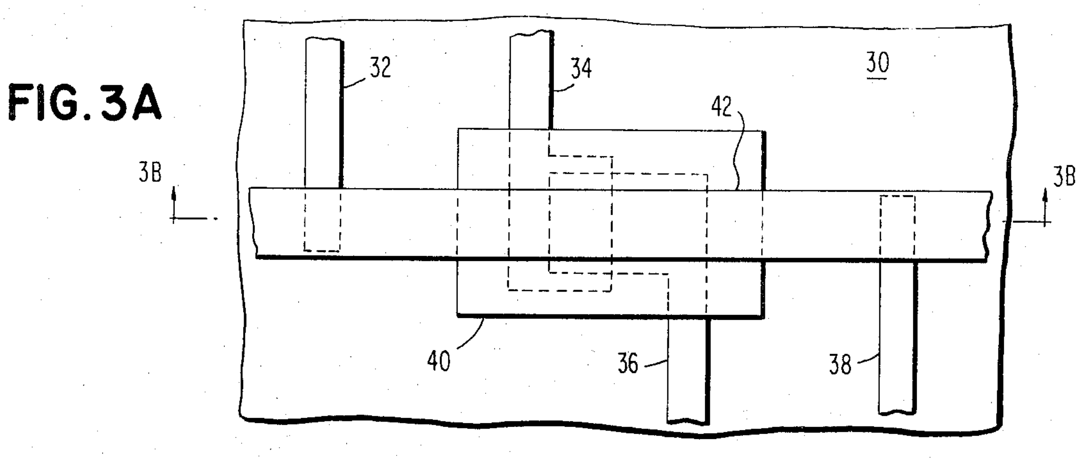
FIGS. 3A and 3B are a top view and cross-sectional side view of a portion of a completed Josephson tunnelling circuit.
Figure 3B:
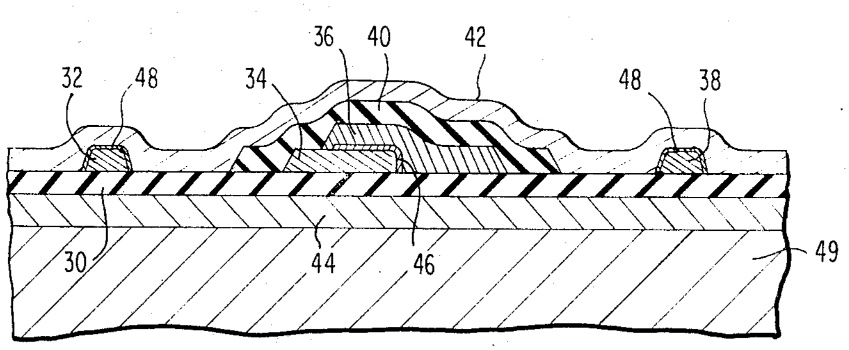

The same circuit portion as shown in FIG. 2D is again illustrated in FIGS. 3A and 3B. FIG. 3A is a top view similar to FIG. 2D, but the covered portions of the layers are indicated by dashed lines. FIG. 3B shows cross-section of FIG. 3A taken along a line through the middle of control line 42. Of the additional numerals found in FIG. 3B, 44 represents the superconducting ground plane, numeral 46 represents the oxide formed during the r.f. oxidation step, numeral 48 represents the thin inherent oxide which will be penetrated by the M4 layer as described above to make a superconducting contact with the M3 and M2 layers, and numeral 49 represents an underlying support.

Superconducting contacts of 2 mil by 2 mil area made between M2 – M4 layers according to the specific example described above were found to carry about 300 milliamps of supercurrent (current at essentially zero resistance) for contacts which were sputter cleaned before M4 deposition and included indium in the M4 layer. Without sputter etching but with indium in the M4 layer, the otherwise identical contacts were found to be superconducting up to about 50 milliamps. On the other hand where sputter etching was performed, but only lead and gold were used in the M4 layer, the otherwise identical contacts were non-superconducting. Furthermore, it appears that the amount of the metal, such as indium, having the relatively high free energy of oxide formation, does not seem to be critical.

What is claimed is:

1. A superconducting circuit on a substrate comprising:

a. a first patterned superconducting layer formed over said substrate, b. a second patterned superconducting layer formed over said substrate subsequent to formation of said first superconducting layer, c. a Josephson tunnelling device comprising an underlying portion of said first superconducting layer, a portion of said second superconducting layer overlaying said underlying portion and a tunnel barrier therebetween, d. a third patterned superconducting layer formed on said substrate subsequent to formation of said second superconducting layer, e. at least one superconducting contact between a portion of at least one of said first and second superconducting layers and a portion of said third superconducting layer which overlays and contacts said portion of at least one of said first and second superconducting layers, and f. said third superconducting layer including a material having a higher free energy of oxide formation than the said superconducting layer which forms the said superconducting contact with said third superconducting layer.

2. A superconducting circuit as claimed in claim 1 wherein said third superconducting layer comprises said material having a higher free energy of oxide formation and a second material, said former material being deposited in contact with the portion of said at least one of said first and second superconducting layers which comprises the said superconducting contact.

3. A superconducting circuit as claimed in claim 1 wherein said material having a higher free energy of oxide formation is a metal selected from the group consisting of indium, gallium, tin, aluminum, lanthanum and manganese.

4. A superconducting circuit as claimed in claim 1 wherein said superconducting contact is formed between a portion of said third superconducting layer and a portion of said second superconducting layer that is not continuous with the said portion of said second superconducting layer forming a part of said Josephson tunnelling device.

5. A superconducting circuit as claimed in claim 1 wherein the major component of said superconducting layer which forms said superconducting contact in conjunction with a portion of said third layer is lead and wherein said material included in said third layer has a higher free energy of oxide formation than lead.

6. A superconducting circuit as claimed in claim 1 wherein said material included in said third layer is indium.

7. A superconducting circuit as claimed in claim 5 wherein said material included in said third layer is indium.

8. A superconducting circuit as claimed in claim 7 wherein said first layer is an alloy of lead and indium and said third layer comprises lead and indium, wherein the indium of said third layer is deposited prior to depositing the lead in forming said third layer.

9. A superconducting circuit as claimed in claim 7 wherein said at least one layer is an alloy of gold and lead and said third layer comprises indium and lead.

10. A superconducting circuit as claimed in claim 9 wherein said third layer also comprises gold.

11. A superconducting circuit as claimed in claim 7 wherein said first layer is a ternary alloy of lead, indium and gold, and said third layer comprises lead and indium.

12. A superconducting circuit as claimed in claim 11 wherein said third layer further comprises gold.

* * * * *

UNITED STATES PATENT OFFICE
CERTIFICATE OF CORRECTION

Patent No. 3,852,795 Dated December 3, 1974

Inventor(s) Irving Ames

It is certified that error appears in the above-identified patent and that said Letters Patent are hereby corrected as shown below:

Column 2, line 27, "defined" should read -- define --; line 55, "Serial No. 654,315" should read -- Serial No. 279,593 --. Column 3, line 44, "if" should read -- is --. Column 5, line 18, "ovelies" should read -- overlies --.

Signed and sealed this 24th day of June 1975.

(SEAL)
Attest:

RUTH C. MASON
Attesting Officer

C. MARSHALL DANN
Commissioner of Patents
and Trademarks

FORM PO-1050 (10-69)

USCOMM-DC 60376-P69
U.S. GOVERNMENT PRINTING OFFICE : 869-930